(12) United States Patent
Holcombe et al.

(10) Patent No.: US 7,372,284 B2
(45) Date of Patent: May 13, 2008

(54) METHOD AND APPARATUS FOR PROBING AT ARBITRARY LOCATIONS WITHIN AN INACCESSIBLE ARRAY OF LEADS THE SOLDER BALLS OR PINS ACTUALLY CONNECTING A VLSI IC PACKAGE TO A SUBSTRATE OR SOCKET

(75) Inventors: Brent A. Holcombe, Colorado Springs, CO (US); Brock J. LaMeres, Colorado Springs, CO (US); Kenneth W Johnson, Colorado Springs, CO (US)

(73) Assignee: Agilent Technologies, Inc., Santa Clara, CA (US)

( * ) Notice: Subject to any disclaimer, the term of this patent is extended or adjusted under 35 U.S.C. 154(b) by 171 days.

(21) Appl. No.: 11/345,007

(22) Filed: Jan. 31, 2006

(65) Prior Publication Data

US 2007/0176611 A1 Aug. 2, 2007

(51) Int. Cl.
*G01R 1/067* (2006.01)
(52) U.S. Cl. .................. 324/754; 324/72.5
(58) Field of Classification Search .............. None
See application file for complete search history.

(56) References Cited

U.S. PATENT DOCUMENTS 6,222,378 B1 * 4/2001 Campbell et al. .......... 324/754
6,614,245 B1 * 9/2003 Endo .......................... 324/754

* cited by examiner

*Primary Examiner*—Ernest Karlsen

(57) ABSTRACT

A probe for an array of interconnecting leads between a PCA and an IC has one or more contacts extending laterally from or plated upon one or more arms formed of a flexible printed circuit, and connected by traces along the arm(s) to a header that itself affords connection to measurement equipment. The flexible printed circuit is thin enough to loosely slide between the top of the PCA or PCB and the bottom of the IC. The arm or arms is/are narrow enough to slide between the adjacent leads forming the array, while the normally flat contacts will successively interfere with, to engage and electrically contact, consecutive layers of leads as the probe is progressively inserted. An arm is not so stiff that it cannot yield by a slight compressive warping as the contacts encounter leads. Indexing may be 'by feel' or by visible indicia along a top surface of the probe or by a reticle device that moves over the top of the IC, which then has a pattern of indicia corresponding to lead location. Forming the shape of a Kapton substrate may also include use of a CVL operating in the range of 250 nm to 290 nm for the creation of extended copper contacts by the removal of underlying Kapton. Plating processes may also be used in the fabrication of (non-extended) wrap-around contacts at the edges of the Kapton.

16 Claims, 10 Drawing Sheets

METHOD AND APPARATUS FOR PROBING AT ARBITRARY LOCATIONS WITHIN AN INACCESSIBLE ARRAY OF LEADS THE SOLDER BALLS OR PINS ACTUALLY CONNECTING A VLSI IC PACKAGE TO A SUBSTRATE OR SOCKET

BACKGROUND OF THE INVENTION

VLSI (Very Large Scale Integration) has, on the one hand, produced packaged ICs (Integrated Circuits) containing amounts of circuitry capable of unparalleled functionality. One the other hand, such complex parts typically have a great many signal having corresponding terminals ('pins') that require connection to an external environment; often many more than can readily be provided by just pins that could be disposed along the periphery of the part. One of the most common solutions to this problem is to use a BGA (Ball Grid Array) package.

The BGA style of IC packaging utilizes an array (whose outline is typically square, or perhaps rectangular, but any suitable shape is possible) of pads on the underside of the IC part that is to be attached to a PCA (Printed Circuit Assembly). A corresponding (mirror image) array of pads is formed on the PCA at the location that is to receive the IC to be mounted. Some BGAs are solid arrays, with a pad at each possible location, while others are only two or three peripheral layers deep, with an empty center devoid of pads. These pads are, of course, connected by traces within the PCA to the various power supplies, grounds and the myriad of input and output signals that cooperate with the BGA part. A patterned paste of powered solder is deposited on the pads of the BGA part and heated. Surface tension causes the formation of domes of solder commonly referred to as 'balls.' At a later time the part is placed onto the PCA, held in alignment and heat is applied during a conventional SMT (Surface Mount Technology) process. That re-heating causes a re-flow of the solder to create individual solder joints between each pad in the array on the part with its corresponding pad on the PCA. The result is a robust and inexpensive assembly process which is very widely used, and is almost universally used for larger ASIC (Application Specific IC) parts, as well as for various other larger ICs.

Alas, this venerable cost effective and efficient style of mechanical mounting and electrical interconnection between an IC and its host PCA presents a difficulty for electrical testing and troubleshooting. The trouble arises because the tasks of testing and troubleshooting generally require the probing of the signals at the pins of the IC, and those pins are frequently not accessible. It may happen that a pin of interest is accessible from the back side of the PCA, but this state of affairs is by no means assured. Owing to layout considerations, intervening ground planes, etc., some pads of the array on the PCA may have 'buried' or 'blind' vias that do not go all the way through to pads the back side. There are even instances of cooperating parts that have been designed to be placed directly in line in with one another (in each other's shadow, as it were, when viewed with 'x-ray vision') on opposite sides of the same substrate (e.g., a printed circuit board). When this occurs, both the 'front side' and 'back side' pads of even a Ball Grid Array having all or mostly through vias are covered by those parts, and no conventional actual electrical access to their pads is possible.

Unfortunately, the very increase in complexity and functionality possessed by those parts needing BGA style mounting is also accompanied by an increased need for testing during system turn-on and troubleshooting. Certain critical signals can often be deliberately made available as accessible test points during the layout process, but a wholesale leading of all pads of a BGA to such test points is undesirable, both from an efficient use of board space, and also from an electrical perspective: high speed signal are often conveyed over transmission lines, and the needed 'tee' connection is an unwanted stub that can distort fast signals and have a severe impact on performance.

The task or troubleshooting a malfunctioning assembly with several large ICs is made more complicated if the technician is deprived of the ability to make signal measurement. Often, the only resort is to component substitution. Vacuum tubes (long gone) and other socketed parts can often be readily exchanged on a trial basis, but it can be downright expensive and time consuming (not to mention the risk of unintentional damage) to experimentally swap out a large SMT BGA part just to see if it is the culprit. Furthermore, in many applications, sockets, unless absolutely necessary for some good reason, are deprecated as unreliable and expensive. It is therefore understandable that one would like to have a more definitive indication of guilt than "Well, this one is the biggest of the five (BGAs), so I think I'll change it first . . . ". But probing the signals of a BGA part to obtain useful information, whether to verify proper performance or collect clues concerning the cause of a failure, is a problematic task.

Aside from probing the back side pads as they might be available (which even if they exist, may itself be a considerable aggravation from a mechanical access aspect), there is another prior art solution that involves mounting the BGA part to its environment through an intervening assembly that makes electrical connection to the necessary signals and makes them available, say in a cable or at an auxiliary array of pins or sockets. This is generally a customized assembly that is specific to the BGA it is intended to service, and as a result is expensive and not universal (usable with many different BGAs). Its use is generally restricted to use in development laboratories and depot level repair facilities for high volume activities (or repair of very high value assemblies) undertaken by major manufacturers. Such radical interposed mounting/probing assemblies are of little or no use to personnel wishing to service a PCA carrying an ASIC for which a custom intervening device is not available.

We would be pleased if there were an inexpensive, fairly reliable and nearly universal method and apparatus for probing, on the front side (i.e., the side carrying the BGA part) any of the signals of an arbitrary BGA-mounted IC, say for measurement by an oscilloscope or logic analyzer. It would especially desirable if such a probing apparatus and method did not depend upon the particulars of the IC (i.e., which pin is what signal), and were relatively independent of the number of the pads (i.e., to the 'size' or the array), but depended mainly on such standard things as pad size and center-to-center spacing of those pads. Such a technique for probing should be convenient, in that no special parts are required, save for a probe suited for a BGA of that pad style. The probe's deployment (and subsequent re-deployments) should require (with perhaps some practice) only a matter of about a minute or less, neglecting any time needed to access the PCA itself. Furthermore, such a technique ought to lend itself to probing more than one signal at a time, whether by multiple instances of a such an apparatus and its method, or by individual apparatuses that simultaneously contact a significant plurality of signals at one time. Finally, such a probing apparatus and method should be easy to use without undue error or confusion, and ought to assist its operator in correctly placing it into contact with an arbitrarily desired pin or pins within the interior of a BGA. In the extreme, this assistance might allow an operator to determine by an inspection (performed subsequent to probe placement) if such a probing apparatus is correctly placed, or if its placement is questioned, determine by passive observation where it is placed.

And upon reflection, we appreciate that much of what has been noted for BGA situations also applies to certain other situations where large ICs with arrays of parallel pins depending from an underside are mounted in zero insertion force sockets. There are times when it is desirable to probe inaccessible pins in that type of an environment. Perhaps a solution for the BGA case would also serve for the other.

Such desirable properties amount to quite a wish list for a probe. What to do?

SUMMARY OF THE INVENTION

We note that an installed BGA IC exhibits a small but significant distance between the surface of the assembly (e.g., a PCB or Printed Circuit Board) carrying the IC and the adjoining bottom surface of the that IC. Owing to surface tension when molten, the solder balls that give the BGA its name remain somewhat ball shaped, even though they are partially 'squashed' at their tops and bottoms (i.e., where they actually encounter the pads). So, for example, barring intervening components that block the line of sight, one can typically expect to 'see' underneath from one side of a BGA to the other (detect light, not actually register an image), through the volume created by the height of the squashed solder balls and their pads and the displacement-within-the-grid separation between those pads. The height just mentioned may be in the range of 0.010" to 0.020" or more.

A solution to the problem of probing the front side (i.e., the soldered-to side) of a BGA interconnection between a PCA and an IC is to fabricate one or more (normally flat within a plane) contacts extending laterally from one or more arms formed of a flexible printed circuit material, and connected by traces along the arm(s) to a header that itself affords connection to the signal measurement equipment that is to measure the probed signal(s).

The flexible printed circuit material is thin enough to loosely slide between the top of the PCA or PCB and the bottom of the IC. The arm or arms is/are narrow enough to slide between the adjacent columns (or rows, if you prefer) of pads forming the array, while the normally flat extending contacts will successively interfere with, to engage and electrically contact, consecutive layers of pads ever deeper within the array along the adjacent columns as the probe is progressively inserted deeper into the gap between the adjacent columns.

The arm or arms is(are) not so stiff that it(they) cannot yield by a slight compressive warping as the contacts encounter solder balls, which encounters produce an increased resistance to insertion and which also forces the contact(s) into the solder ball(s) for good electrical contact. The bulk of an arm is narrower than its contact(s), so that insertion resistance is again minimized whenever the contact (s) is(are) between successive pad layers and is(are) not warped through compression by contact with nearby pads. The arm or arms are stiff enough to be pushed past such successive regions of resistance, between regions of which are perceptively lessened resistance to insertion. Thus, as the contact(s) encounter a solder ball the episodic force needed to warp the arm to squeeze past the ball both creates a periodic perceived resistance that may be counted to allow an indexing of the probe's penetration (i.e., how many pin-layers in is it?)

The shape of a contact that touches a solder ball for electrical connection thereto may be a concavity, a convex region, a flat region, or one of the preceding with some sort of detent, such as a notch. In the case of a flat region, it's edge might be parallel to the line of progressive insertion, or at an angle thereto. In any event, the width of the probe at the contact(s) is slightly wider than the narrowest distance between two adjacent solder balls and through which the line of advance requires it to pass. It is this interference that produces the compressive warping that allows the probe to pass in and out, while at the same time urging the contact(s) into the solder ball(s) that they may be touching. Regions of the probe that do not carry contacts are narrow enough to slide freely between adjacent solder balls.

It will be appreciated that to permit compressive warping the flexible printed circuit material of which the probe is made may be somewhat thinner than the height of the intervening space or gap that it is to enter.

We shall use the term 'interjacent BGA probe' to mean a structure that: (1) Slips between a substrate and a BGA-mounted IC mounted thereon; (2) At the same time travels along straight 'corridors' or pathways provided, or defined, by the regular row and column arrangement of the BGA pads; (3) Has one or more contacts disposed along the structure for making contact with solder balls formed on those pads; and (4) Has conductive traces coupling the contacts running parallel to the direction of probe travel and out from under the IC to connect to some item of test equipment signals of interest touched by the contacts. 'Interjacent' is indeed a real word: it means 'lying or being between or among.' It is not a bad description of a central property of the probe that is seldom, if ever, found in other probes. After a while it sort of grows on you. You will, however, be forgiven if this is the first time in a year or more (ever?) that you have encountered that particular word.

Alternatives to indexing the interjacent probe 'by feel' are to affix visible indicia along a top surface of the probe (similar to a crankcase dipstick for an engine) to indicate in suitable units (inches, millimeters or integral layers of pads) how far the probe has penetrated. A further refinement is to equip the probe with an external pincer member that has one or more 'peep sights' or other reticle device that is both externally visible and registered above the pad or pads that are presently contacted by the probe. In cooperation with this arrangement the top surface of the IC can be printed with a pattern corresponding to the pad locations (one or more of which then appear in the peep sight(s)), or a sticky backed template bearing such indicia can be registered and affixed to the top surface of the IC ahead of time.

The interjacent probe method can be used in other applications besides just those involving a BGA. Consider a different style of IC packaging and mounting, such as the ZIF (Zero Insertion Force) sockets used in connection with ICs having an array of extending parallel cylindrical pins in place of a BGA. For example, one version of the Intel Pentium Pro microprocessor had nearly four hundred 0.018" diameter pins 0.125" long arranged in two to five layers with 0.100" centers around an empty center region of about 1.4" by 2.2", all on a substrate of about 2.5" square. To mount the IC one moved a lever on the socket that released all tension. The part then slid easily into the socket, after which the lever was moved back and locked down. The lever was mechanically coupled to grippers for each pin within the socket, securing the part in place and creating good contact pressure to promote good electrical connections. This manner of interconnect was desirable because of the high overall force that would otherwise be needed to force the part into (or remove it from) a regular socket, while the size and shape of the part made maintaining alignment by hand (i.e., in the field) problematic, with a resulting high likelihood of bent pins/broken substrate/socket for a very expensive part (not to mention the damage to the motherboard . . . ).

For cost reasons ZIF-socketed parts are not as prevalent as before, but they remain available and suitable for some applications. Now suppose that it is desirable to probe the signal on some pin of a ZIF-socketed part. We see immediately that all the aggravation of probing a BGA part obtains, and for pretty much the same reason: you can't get to the pin of interest or to its corresponding pad; they are inaccessible.

Now consider an 'interjacent pin probe' to mean a structure that: (1) Slips between a socket (or an array of mounting holes on a PCA) and an IC mounted therein; (2) At the same time travels along straight 'corridors' or pathways provided, or defined, by a regular row and column arrangement of signal pins descending from the IC; (3) Has one or more contacts disposed along the structure for making contact with those pins; and (4) Has conductive traces coupling the contacts running parallel to the direction of probe travel and out from under the IC to connect to some item of test equipment signals of interest touched by the contacts.

How would one use such an interjacent pin probe to probe an arbitrary pin of a ZIF-socketed part? Well, release the tension on the part and lift if up by some slight amount, say 0.015" to 0.020", using, say, several identical shims. Then re-apply tension, remove the shims and proceed to probe the exposed 'forest of pins' between the top of the socket and the bottom of the IC, just as for the BGA case. The dimensions and proportions of the interjacent pin probe might be somewhat different from the BGA case, but the manner of probe operation would be essentially identical, and the resemblance between the probes unmistakable.

Finally, a close reading of the above description for interjacent pin probe reveals it says nothing about any socket, ZIF or otherwise. Hmmm. That is, suppose you encounter a large IC with many pins within an array on the bottom side of the IC and that might otherwise have been mounted with a socket, but, for whatever reason, those pins were simply soldered to pads on a PCA. Now suppose that there were a small and fairly uniform gap separating the top of the PCA and the bottom of the IC, just as in the BGA case. (Temporary shims or 'spacer legs' depending from the IC could provide the size and uniformity of the gap.) It is clear that an interjacent pin probe would work just as well in this case as it would in the case of a socketed part. Similar remarks also apply to the case where an LGA (Land Grid Array) is used to connect the IC to a PCA. (An LGA uses an array of spring contacts to mate with an array of flat pads on the IC's package).

In the case where Kapton is the flexible printed circuit substrate material and it is clad with copper foil, the shapes of copper traces, pads and contacts may be produced using any of the usual conventional photo-etching processes, while forming the shape of the Kapton substrate may also include (besides shearing, die cutting, drilling and routing) Kapton removal through the use of a CVL (Copper Vapor Laser) operating in the range of 250 nm to 290 nm. This is particularly so for the creation of extended (exposed beyond the periphery of the substrate) copper contacts by the removal of underlying Kapton, and the creation of vias, whether blind or through, in multilayer embodiments. Plating processes may also be used in the fabrication of (non-extended) wrap-around contacts at the edges of the Kapton.

DESCRIPTION OF A PREFERRED EMBODIMENT

Figure 1:
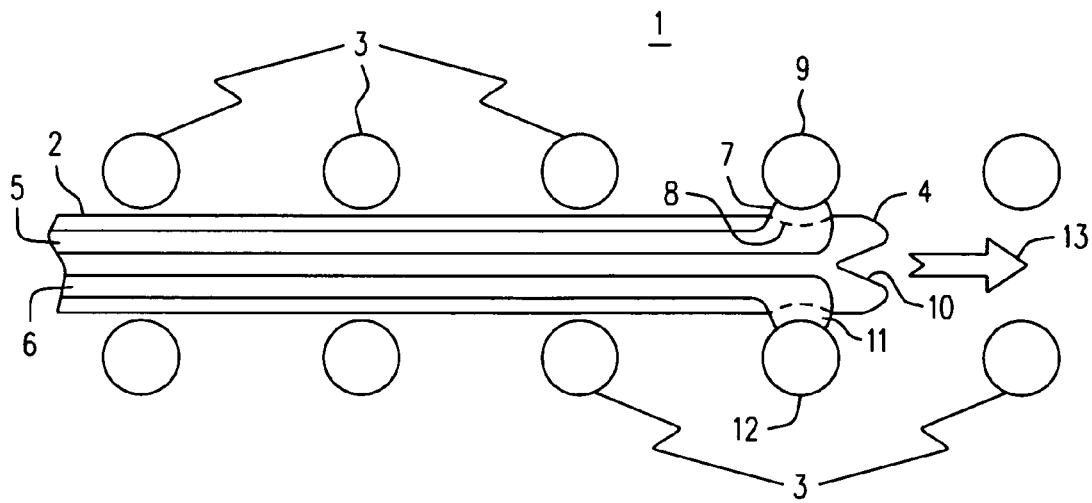
FIG. 1 is a simplified partial top view of a first embodiment of an interjacent probe for probing the signals associated with either a BGA-mounted IC or an IC mounted with an array of pins.

Refer now to FIG. 1, wherein is shown a simplified top view of a first embodiment 1 of an interjacent probe for probing the signals associated with either a BGA-mounted IC or an IC mounted with a similar array of pins. A long narrow and suitably thin 'arm' 2 of printed circuit substrate material (which may be of Kapton) passes freely along a straight path defined by the interstitial areas between rows and columns in an array 3 of solder balls (the BGA case) or of mounting pins. The IC that is the occasion for the array 3, and the PCA or PCB that is to carry that IC, are not shown. The arm carries conductive traces 5 and 6 that may be of copper.

To assist in the penetration of the arm 2 along the straight path in a direction indicated by arrow 13, the arm 2 may have a rounded nose 4. As an alternative, the rounded nose 4 might shown in this embodiment 1 includes a notch 10 (other alternatives will be presented in due course) whose function would be to increase the ease with which the nose can be compressively warped as it passes between two adjacent solder balls or two adjacent pins, such as 9 and 12.

To appreciate this notion of compressive warping, note the contacts 7 and 11, respectively formed at the end of the traces 5 and 6. The particular shape of these contacts notwithstanding (these are concave) the maximum distance between the contacts 7 and 11 exceeds the minimum distance between leads 9 and 12. That much is easy to see from the figure. However, it is actually preferred that even when the concavities mate, or almost nearly mate, with the leads 9 and 12, that the contacts 7 and 11 remain in compression, and for this to be so regardless of the particular shape of the contacts. When the contacts 7 and 11 experience compression (i.e., they are pushed toward each other), something is expected to compress or deform. We prefer that this not occur at the expense of having metal scrapped out of the leads 9 and 12 (if our probe generated metal flakes underneath the IC it would be downright dangerous to use . . . ) or at the expense of too much wear and tear on the exposed contacts 7 and 11. Instead, we want the region of the arm bearing the nose and the contacts to bend or warp away from lying in a plane and form a slight arch, instead. The ends of the arch are the points of contact between the contacts (7, 11) and the leads (9, 12). To the extent this deformation is resisted by the material of which the arm 2 is made, contacts 7 and 11 are urged against leads 9 and 12, which is good for electrical contact. As mentioned above, we prefer that even when the leads touch concave contacts at the deepest point in the concavity the contacts remain in compression.

Compression created on the contacts by the leads is also good for keeping track of how far in the interjacent probe has been inserted. So, for example, in FIG. 1 we would expect that the situation of having contacted leads 9 and 12 is readily detected by noting that this is the fourth time since insertion that a periodic variation in the insertion force has been encountered. (That assumes, of course, that the array 3 does not extend further to the left than is shown.) So, if we knew ahead of time that leads of interest 9 and 12 were indeed in the fourth layer in, starting at the outer layer, then we could be assured that the probe is connected to the desired leads of interest, provided that we also inserted the probe into the correct 'corridor' (interstitial path whose direction is at right angles to that of the 'layers').

It will be noted that the Summary mentioned that to permit compressive warping the flexible printed circuit material of which the probe's arm 2 is made may be somewhat thinner than the height of the intervening space or gap that it is to enter. This is to allow 'head room' for the compressive warping to occur. If this were not the case (say, there were a snug fit, or nearly so) then the flexible (but typically not compressible) substrate of that printed circuit would have to deform in an extensible manner under compression (be 'squishy,' like rubber) to get past the obstructions presented by the solder balls or pins, lest there be a serious interference problem that either prevents insertion or gouges out and distributes solder debris, or ruins the shape of a thin copper contact as it is repeatedly forced past a relatively stout brass pin. But a squishy or rubbery substrate does not comport well with pushing to insert it (suppose it bends . . . ), and are not substrate properties that bode well for the health (long term continuity) of any conductor (as 5 and 6) that it is to be carried by such a squishy substrate.

Finally, note that contacts 7 and 11 do indeed extend toward leads 9 and 12 beyond the edge of the arm 2. We have referred to these contacts as being 'extended.' To this end, the substrate material of the arm may be removed for a slight distance proximate the edge of the region of the contact that is to bear against the lead. The reason for doing this is to ensure that it is the conductive material of the contact that is urged against the lead, and that the force of compression at the region of interference is not borne instead by the insulating substrate material of the arm 2 (i.e., the better to get a low ohmic metal to metal connection).

Figure 2:
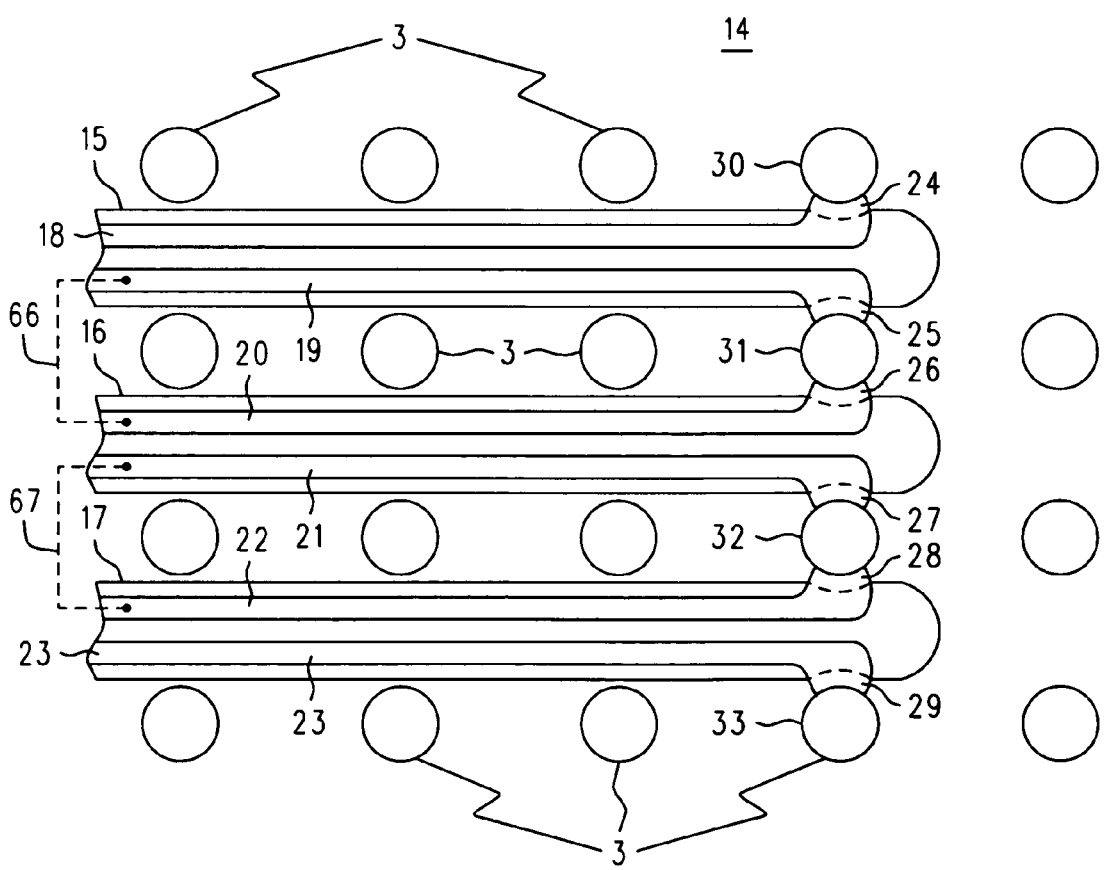
FIG. 2 is a simplified partial top view of a second embodiment of an interjacent probe for probing the signals associated with either a BGA-mounted IC or an IC mounted with an array of pins.

FIG. 2 shows a second embodiment 14 that is similar in its major aspects to the embodiment 1 of FIG. 2, save that it has three adjacent arms 15, 16 and 17, each of which is comparable to the arm 2 of FIG. 1. The major difference is that within a portion of the interjacent probe that has not yet been discussed (but which discussion will occur in due course) the traces 19 and 20, and 21 and 22, are electrically connected together as shown by the dotted lines 66 and 67. The effect of this is to provide TWO connections to lead 31 via contacts 25 and 26, and two connections to lead 32 via contacts 27 and 28. This provides redundancy that make the connection to leads 31 and 32 more reliable, reduces the ohmic value of the overall connection, as well as reduces the total inductance of the electrical path for the parallel combination of traces 19 and 20, and also that of traces 21 and 22. The benefit here is similar to the one mentioned at lines 9-19 of column 2 in U.S. Pat. No. 5,923,177, entitled PORTABLE WEDGE PROBE FOR PERUSING SIGNALS ON THE PINS OF AN IC (Robert H. Wardwell, issued 13 Jul. 1999). And while mention the notion of redundant contact, and note that it is nice, we by no means wish to imply that it is necessary: non-redundant contact IS contact, too.

In the three-arm example of FIG. 2 only leads 31 and 32 have redundant contact, while the leads 30 and 33 have only the style of contact achieved in FIG. 1. It is clear, however, that if there are n-many adjacent arms, then the only the two arms at the outside ends of the n-many are associated with leads that are excluded from the redundancy; the innermost (n−2)-many leads ARE benefited by redundancy. It is also clear that other numbers (two, five, eight or ten) of adjacent arms is a practical matter. It is also clear that, assuming the pin out of the device of interest permitted or required it, two six arm interjacent probes could together probe as many as twelve signal, of which two groups of four would be redundantly probed. This could allow an entire eight-bit byte to be (redundantly) acquired at once. Clocks and or qualifier signals also of interest might be on the other (non-redundantly) probed leads, or, could be probed (redundantly or not) by yet other interjacent probes(s).

Another difference between FIGS. 1 and 2 is that the rounded nose for the arms 15-17 in FIG. 2 is a plain rounded nose with no removed material (such as notch 10 in FIG. 1) to lower the force needed to compressively warp the region bearing the various contacts 24-29.

Figure 3:
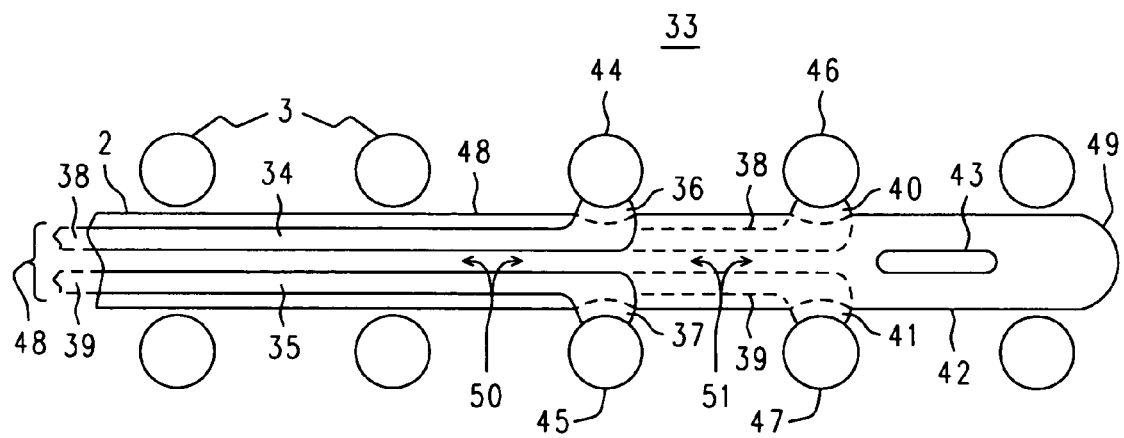
FIG. 3 is a simplified partial top view of a third embodiment of an interjacent probe for probing the signals associated with either a BGA-mounted IC or an IC mounted with an array of pins.
Figure 4:
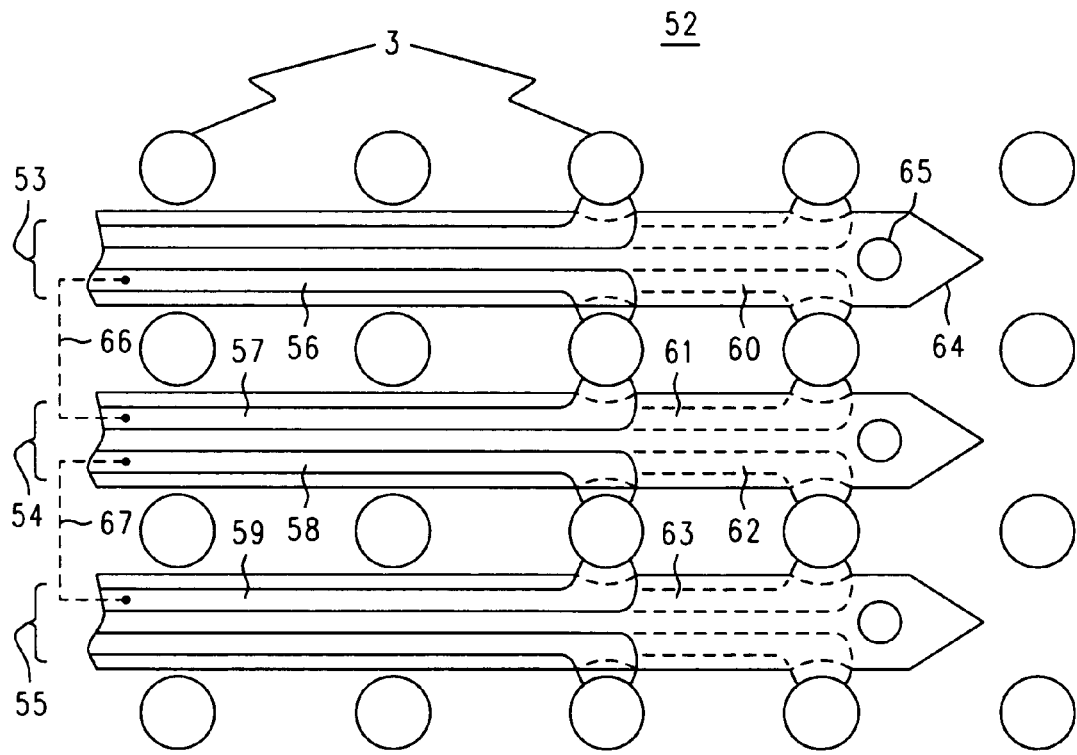
FIG. 4 is a simplified partial top view of a fourth embodiment of an interjacent probe for probing the signals associated with either a BGA-mounted IC or an IC mounted with an array of pins.

Refer now to FIGS. 3 and 4. As FIG. 2 was similar to FIG. 1, FIGS. 3 and 4 are each respectively similar to FIGS. 1 and 2. Once again there are some principal differences. In this case each of FIGS. 3 and 4 has multiple contacts along each arm, allowing IC leads on different layers of the array to be probed at the same time. It is quite possible that multiple contacts along an arm might require multi-layer printed circuit techniques to allow the necessary number of traces to travel along the limited width of the arm. However, multi-layer flexible printed circuit assemblies (of, for example, Kapton), complete with all manner of vias, are conventional.

As it is, the examples of FIGS. 3 and 4 require only four traces on each arm; in the embodiment 33 in FIG. 3 arm 48 has traces 34 and 35 on a 'top' side of the arm, which terminate in extended contacts 36 and 37, respectively, while on the 'bottom' side of the arm traces 38 and 39 travel to extended contacts 40 and 41, respectively. Contact 44 touches lead 44, contact 37 touches lead 45, both of which are in the same layer of leads. Contacts 40 and 41 touch leads 46 and 47, respectively, both of which are also within a common layer, but which is a different layer than for contacts 36 and 37. Thus the flexible printed circuit substrate for arm 48 need not necessarily in this instance be a multi-layer affair; double sided is sufficient.

A further difference concerning the embodiment 33 of FIG. 3 is that has an extended nose 49 (which is this instance just so happens to be rounded—it might tapered or pointed as shown in FIG. 4). The nose 49 is extended by the length of region 42. Such an extended region may be useful in helping the operator steer the arm 'straight' for a sort distance before the most distal contacts (40, 41) encounter any leads. The idea is to reduce the wear and tear on those contacts that might arise when the direction of insertion is not quite parallel to the 'corridor' formed by the leads and that is to occupied by the arm 48. Another way to think about it is that the extended nose 42/49 gives the arm 48 a chance to 'get started' for a significant distance with little or no insertion force needed before a increased amount of such force is required. If the operator is counting episodes of such increased force, he or she may genuinely appreciate the notion of 'let's do one thing at a time,' or successfully getting the interjacent probe 'started' and the subsequent task of locating it on a particular layer.

Yet another difference is that embodiment 33 has a slot 43 in place of the notch 10 of FIG. 1. Once again, the function of this feature is to create a region where the force needed to begin the compressive warping is temporarily reduced as the contacts begin to encounter the leads. In this embodiment we have shown only one slot ahead of contacts 40 and 41. If the nature of the substrate for the arm 48 is such that compressive warping at contacts 40 and 41 does not aid that for contacts 36 and 37 (i.e., say the effects of warping do not extend that far), and the lack of such aid is judged to require too much insertion force, then another slot (not itself shown) could be located at one or both of locations 50 and 51.

Now briefly consider the embodiment 52 shown in FIG. 4. It has three arm 53, 54 and 55 that each have a pair of traces on the top side and another pair on the bottom side, so that each arm can four extended contacts that touch two leads in one layer and two in another. In the figure we have shown that each of the arms deals with the same layers (of the array of leads). This would not have to be so; if desired an interjacent probe after the manner of 52 could be fabricated so the leads in the array touched by an arm are totally independent from those touched by any other arm. To continue, we prefer that, just as in the embodiment 14 of FIG. 2, pairs of traces (56, 57 and 58, 59—as well as 60, 61 and 62, 63!) that terminate in contacts that touch the same lead are electrically connected together to produce paralleled traces to the same leads. We have shown that with the dotted lines 66 and 67 for traces 56, 57 and 58, 59 on the top side. To avoid cluttering the figure we made no attempt to include a similar notation for the traces 60-63 on the bottom side to indicate that they, too, are similarly connected. Mentioning it here in the words should be sufficient.

Finally, note that each of the arms 53, 54 and 55 has a tapered or pointed nose (64), and that the compressive warping assistance mechanism is a circular hole (65) proximate the pair of contacts to be assisted.

Figure 5A:
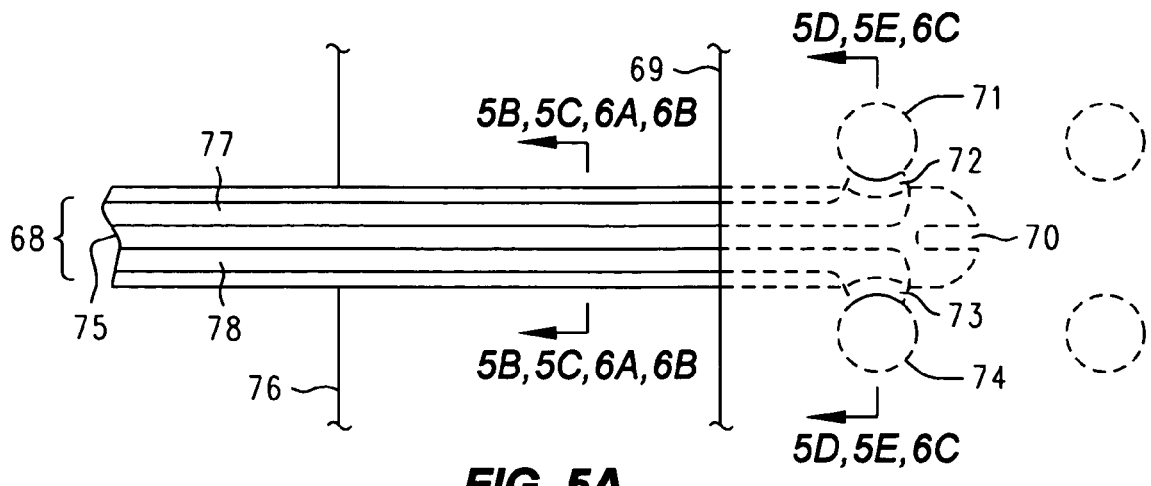
FIG. 5A is a simplified top view of an interjacent probe similar to the embodiment of FIG. 1 after its arm has been inserted beneath an IC until its contacts are aligned with a pair of IC leads, and indicating the locations of the sectional views in FIGS. 5B and 5C.
Figure 5B:
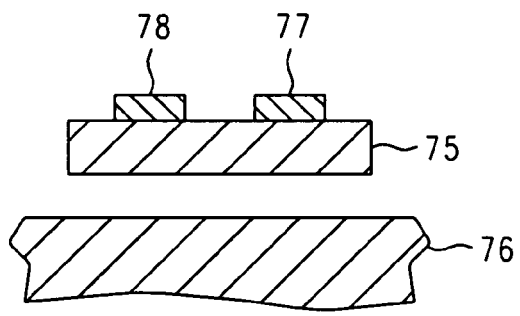
FIG. 5B is a simplified sectional view of the arm of FIG. 5A in a case where the arm is a single sided flexible printed circuit that carries just two traces for probing two leads.
Figure 5C:
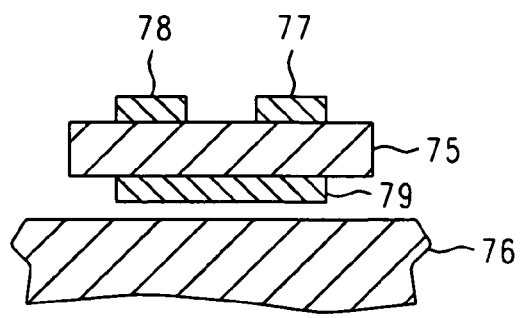
FIG. 5C is a simplified sectional view of the arm of FIG. 5A in a case where the arm is a double sided flexible printed circuit that carries a ground plane on one side and the other side carries two traces that are strip transmission lines.

Now consider FIGS. 5A-C. In FIG. 5A we see a simplified top view of an embodiment for an interjacent probe resembling that of FIG. 1. Now, however, it is shown as having a slot 70 in its rounded nose as a compressive warping assistance mechanism, instead of the notch 10. Also, it is now shown as having been inserted in the gap between an IC (the IC is shown only by its edge 69) and a PCA (shown only by its edge 76, the edge of which was chosen to be in a location convenient for the drawing and our immediate purpose, but which might otherwise be anywhere relative to the IC).

To continue with FIG. 5A, substrate 75 of arm 68 carries two traces 77 and 78 which terminate in respective extended contacts 72 and 73, which in turn respectively bear against leads 71 and 74 (through compression caused by warping).

Turning now to FIG. 5B, we see the above-the-PCA-but-not-yet-beneath-the-IC cross section for the case, as for FIG. 1, where there are just two traces on the top side of the substrate 75 of the arm 68. Advancing to FIG. 5C, we note that the addition of a ground plane 79 on the bottom side of the substrate can turn traces 77 and 78 into strip transmission lines, if such were desirable.

Figure 5D:
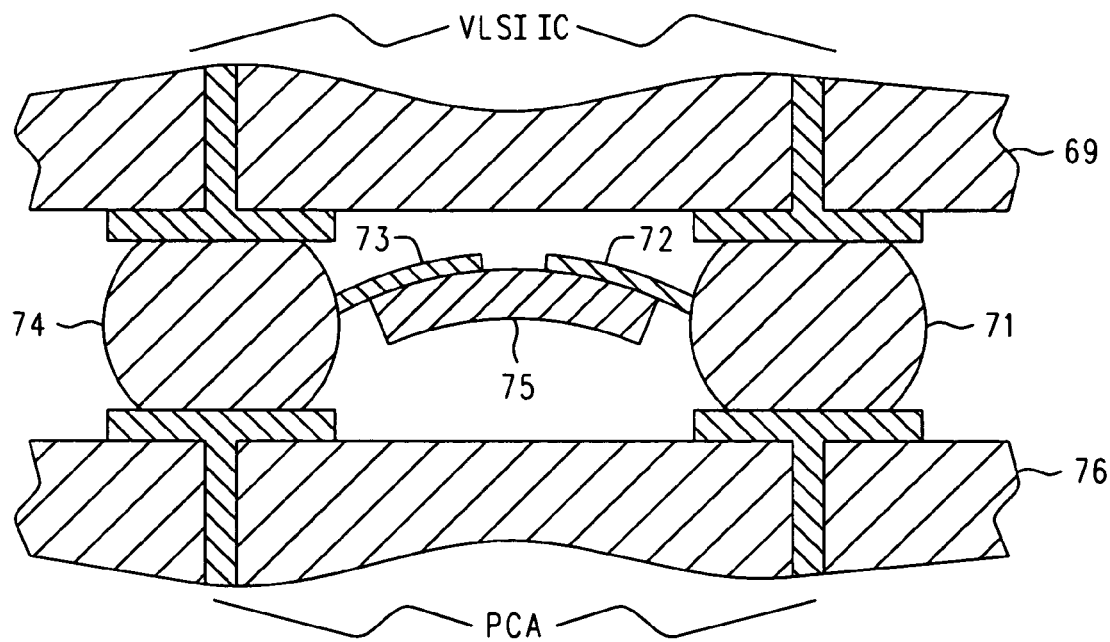
FIG. 5D is, for the case of FIG. 5B, a simplified sectional view of the contacts of FIG. 5A as they exhibit compressive warping.

What we see in FIG. 5D is the cross section of FIG. 1 at a location where the contacts 72 and 73 respectively bear against the leads 71 and 74. And although we have shown these leads to be solder balls in a BGA, it will be appreciated that the leads themselves might as easily be reals pins. In any event, the purpose of the figure is to make clear, from the arched nature of substrate material 75 (e.g., Kapton) and of the extended copper contacts 72 and 72, that those elements (75, 72, 73) are in compression. The arching is achieved because the distance between the leads is less than what is required by the contacts. The probe arm resists arching until forced to do so, and it is that force that urges the contacts against the leads.

Now, we must dally here for a moment to dispense with some potential complications. Whether the leads 71 and 74 are solder balls or genuine cylindrical leads, but especially in the case of the solder balls whose sides are generally spherical, the following objection might be raised: "Hey, what happens if the tip (contact) of the probe twists (or is rotated by a twist in the arm near but not at the contact), so that it spans the largest diagonal distance from the top of one lead to the bottom of the other? Might there be no compression, or even no electrical contact at all?" Indeed, the proportions of the drawing in FIG. 5C would seem to suggest that such might be possible. We reply as follows.

First, the height of the solder balls might not be enough to actually allow such looseness, and instead actually does force compressive warping, even if it is diagonal.

Second, increasing the width of the probe tip across the contacts can produce, within limits, the same result.

Figure 5E:
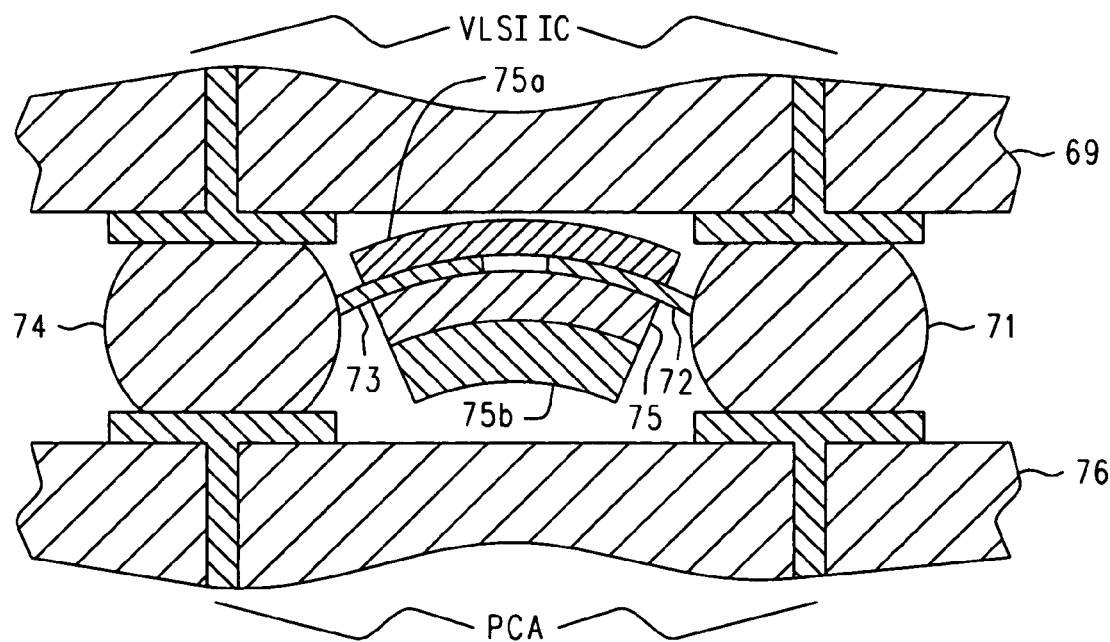
FIG. 5E is similar to FIG. 5D, but includes extra layers of flexible printed circuit substrate material to exhaust excessive headroom to prevent twisting and ensure the occurrence of compressive warping for good electrical contact between the interjacent probe's extended contacts and the leads being probed.

Third, if needed, we can eliminate the freedom of the probe to twist by making it thicker, so as to more snugly (yet still freely) fit in the gap between the IC and its PCA. For example, we can use a different thickness of material 75. Furthermore, we can add, as is shown in FIG. 5E, centering or buffer layers (75a and 75b) of flexible printed circuit substrate or covering material (i.e., we add shims). The additional thickness of the probe forestalls any twisting. Upon reflection, it will be appreciated that some headroom must be left, however, so as to actually permit the necessary amount warping to occur. (We don't want the extended contacts to be peened over, nor debris to be gouged from the leads . . . .)

Fourth . . . . However desirable it is to eliminate the mischief of twisting by the probe tip, increasing its thickness can have the accompanying undesirable result of raising the force needed to cause warping to unacceptably high levels. If that should occur, it can to an extent be mitigated by reducing the amount of interference (the amount the probe tip is wider than the space between the leads) so that less warping is needed. This strategy has a limit related to the margins for controlling the two distances involved, and thus their resulting amount of interference. Prudence requires that we be able to reasonably expect at least a certain minimum amount of interference. But what guarantees a minimum amount of interference at one marginal extreme might, at the other marginal extreme, produce too much.

Fifth, the variation in force required to produce greater and lesser amount of warping can be scaled downward by choosing a suitable compressive warping assistance mechanism. This allows us to select a width across the arm/contact that is guaranteed to produce compressive warping and yet independently influence the amount of compressive force involved. Such a mechanism can be a notch, or one or more slots or holes, in the substrate material of the probe and located proximate the contacts that are to undergo compression. This business of selecting a suitable compressive force assistance mechanism, should one be necessary, has then the further benefits of providing the operator of the interjacent probe with consistent and agreeable amounts of insertion (and removal!) force, as well as limiting the wear and tear on the probe caused by routine use.

Finally, note that even though the figure depicts the compressive warping as being 'upward' (toward the IC 69), it might just as easily occur in the opposite 'downward' direction (toward the PCA 76). Also, even though the figure shows two contacts bearing against two leads, it will also be appreciated that the preceding discussion also applies to situations were there is only one contact at the end of the arm, as in FIGS. 7 and 8 (in which cases the compression is between the sole contact and the opposite side of the arm).

Figure 6A:
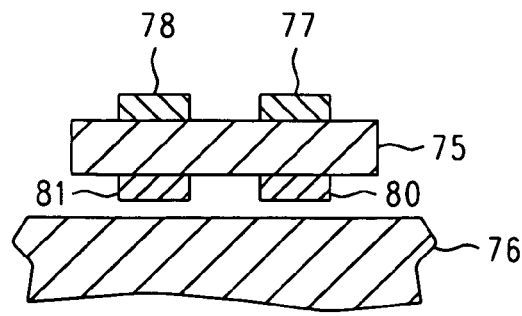
FIG. 6A is a simplified sectional view similar to that of FIG. 5B, but for an arm that is a double sided flexible printed circuit for carrying additional traces for probing additional leads.
Figure 6B:
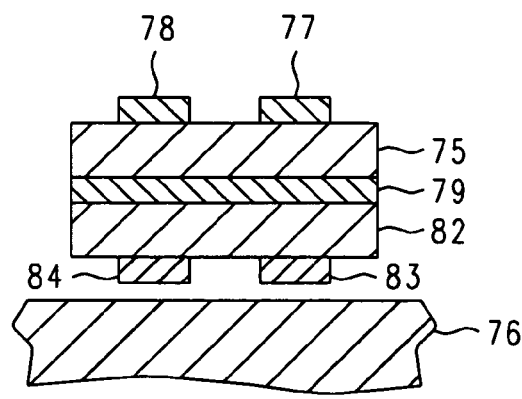
FIG. 6B is a simplified sectional view similar to that of FIG. 5C, but for an arm that is a multi-layer flexible printed circuit for carrying additional transmission lines for probing additional leads.

Now consider FIGS. 6A and 6B. We include these, which are similar to FIGS. 5B and 5C, to make it clear that double sided and multi-layer flexible printed circuit techniques are applicable to an interjacent probe. In FIG. 6A we see the addition of two more traces 80 and 81 on the underside of the (now double sided) substrate 75. In FIG. 6B the substrate 75 has appended to it a ground plane 79 and a second substrate 82. The second substrate 82 carries two additional traces 83 and 84, and the resulting multi-layer can be used as four strip transmission lines; two on top and two on the bottom, separated by a common ground plane 79.

Before proceeding, we should pause briefly to consider the combined circumstance represented by FIGS. 1, (or 5A) and 6A, and contrast that with what is shown in FIG. 3. To begin this short digression, FIG. 3 (and 4) suggest that if there are two traces, one on each top and bottom surface of the probe, then that pair of traces can be used for connecting to leads in different layers (by having the those traces extend different distances along the arm). And then, if redundant contact for those leads is desired, use another pair on an adjacent arm, as described in connection with FIGS. 2 and 4. That is all well and good, but it is not the only way to get more than one contact to touch a given lead. Consider FIG. 6C. Upper and lower traces on the same (left or right) side of the (same) arm can both be for a common lead. That is, they can each terminate at an extended contact that touches the same lead. In such a case the two traces involved would be brought into common electrical contact, just as mentioned (66, 67) in connection with description of FIGS. 2 and 4. This might happen twice, once for both the left and right sides of an arm, as is shown in FIG. 6C, or simply once on just one side or the other, in a case similar to what is shown for FIGS. 7 and 8.

Figure 6C:
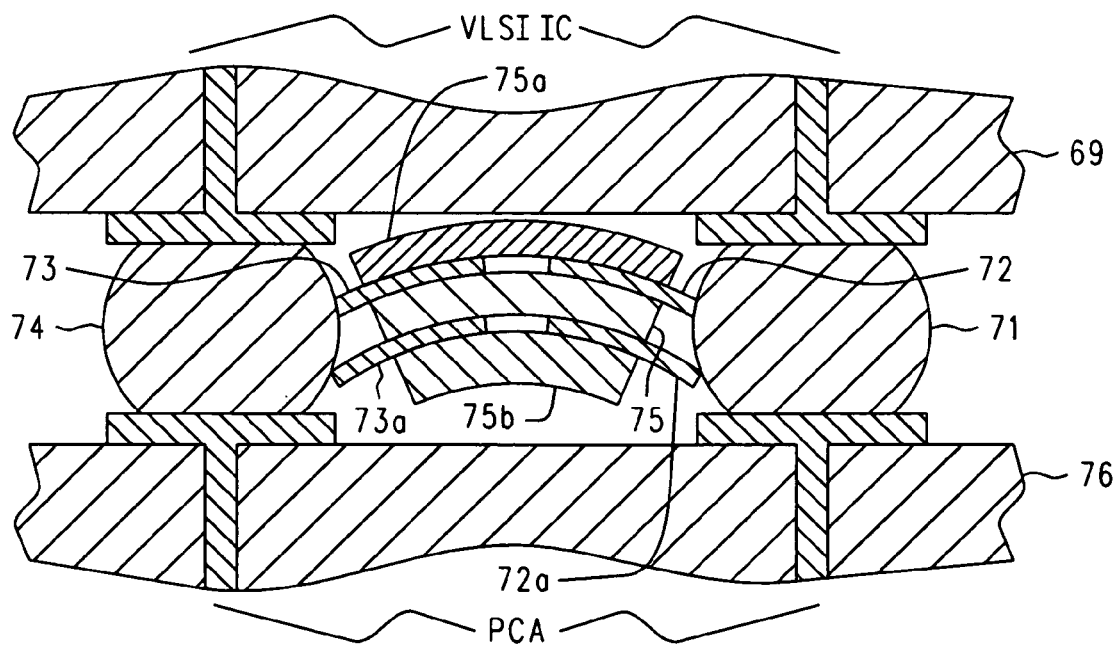
FIG. 6C is a simplified sectional view similar to FIG. 5E and representing the combined circumstances of FIGS. 1 (or 5A) and 6A, where two contacts on the same side of an arm touch the same lead.

A brief note is in order concerning the view shown in FIG. 6C. In the figure it appears that the various layers of dielectric substrate (75a, 75 and 75b) get shorter while the copper trace/extended contacts (72, 73/72a, 73a) get longer. This is a discrepancy that arises from the need to show all four contacts touching their respective leads (whether those be solder balls or genuine cylindrical wire leads), in conjunction with what is probably an exaggerated amount of compressive warping. What is more, we don't know which direction the warping will occur in, or, if it will be a simple arc as shown, or form as an S-curve. What we can say is that we prefer that, since we can't readily control the warping, the various layers 75 are all fabricated having the same width, as are the various layers of contacts 72 and 73. These same observations also apply to FIG. 5E.

Figure 7:
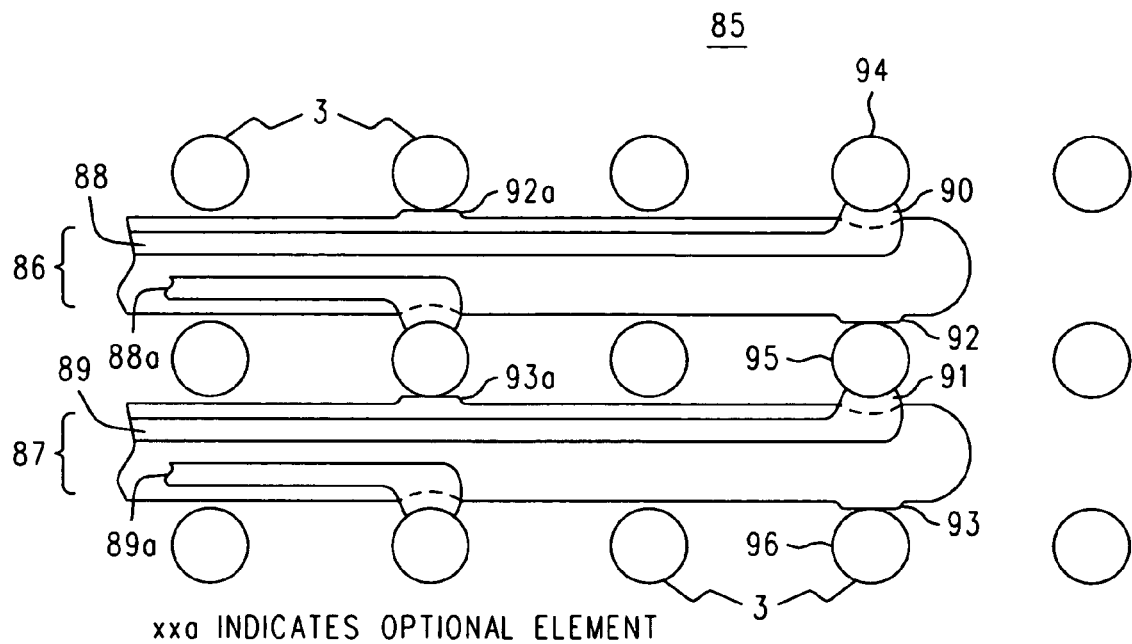
FIG. 7 is a simplified top view of another embodiment for the arms of an interjacent probe.

We now consider some additional embodiments for an interjacent probe that concern various strategies for touching leads with extended contacts formed upon the arms of an interjacent probe. Refer now to FIG. 7, wherein is shown an embodiment 85, where two arms (there might be only one, or there might be more than two) 86 and 87 each carry a respective single trace (88, 89—temporarily ignore 88a and 89a) that terminates in a corresponding concave contact (90, 91). Contact 90 is to bear against lead 94, while contact 91 is to bear against lead 95. In order to get this to happen through compressive warping, each of arms 86 and 87 includes a respective raised land (92, 93) in the side of the arm opposite the contact (90, 91). These raised lands provide the extra width at the location of the contact to create the compressive warping as land 92 bears against lead 95 and land 93 bears against lead 96.

Figure 8:
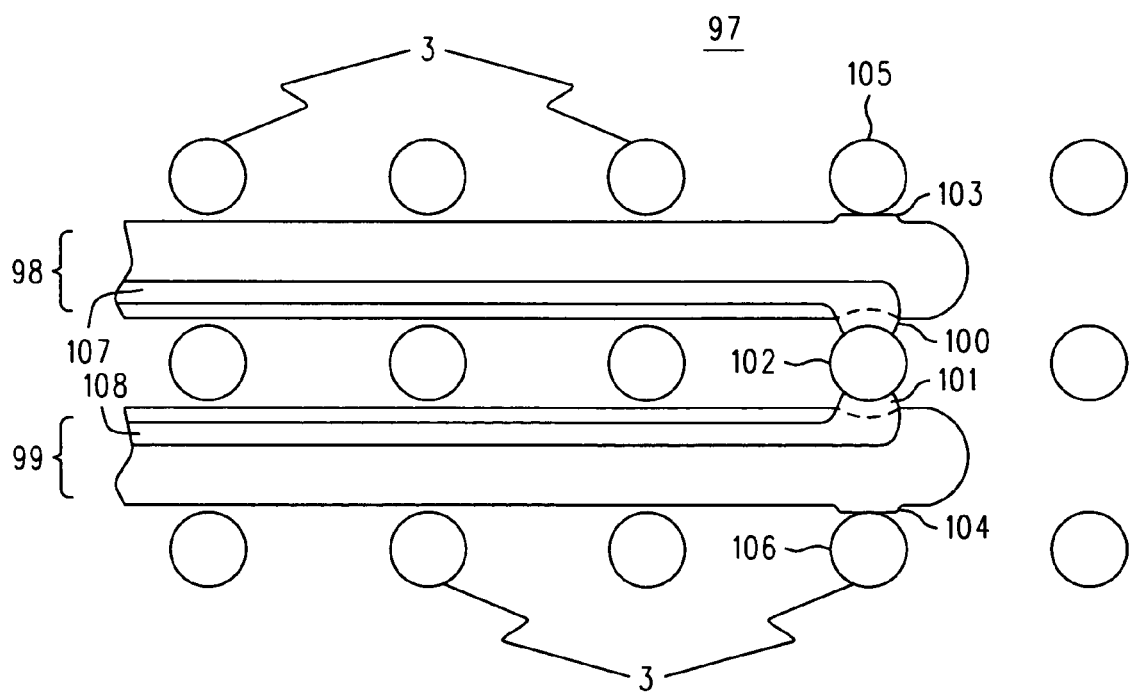
FIG. 8 is a simplified top view of yet another embodiment for the arms of an interjacent probe.

An analogous situation for a slightly different embodiment 97 is shown in FIG. 8. In this embodiment 97 a pair of arms 98 and 99 each carry a respective single trace (107, 108) that terminates in a corresponding concave contact (100, 101) each bearing against lead 102. In order to get this to happen through compressive warping, each of arms 98 and 99 includes a respective raised land (103, 104) in the side of the arm opposite the contact (100, 101). These raised lands provide the extra width at the location of the contact to create the compressive warping as land 103 bears against lead 105 and land 104 bears against lead 106.

It will, of course, be appreciated that when we said above for FIGS. 7 and 8 that each arm had just one trace, the actual situation is that a given surface of each arm had but one trace. The other surface of the arm could, as shown in FIGS. 3 and 4, have their own traces that, after the manner of FIG. 6C, run to contacts for the same lead as the trace on the other side. The top view in FIGS. 7 and 8 would be the same, but now there would be redundant connections for leads 94 and 95 on each arms 86 and 87 in FIG. 7, and a 'double doubly redundant' instance of four extended contacts(!) touching lead 102 in FIG. 8.

We can even relax the single trace condition for either of embodiments 85 and 97, although we indicate it only for embodiment 85 in FIG. 7 as 88a, 89a 92a and 93a. Note therein that for each arm 86 and 87 we have added an optional additional trace that runs to a contact for a lead different than 94 or 95. As before, these additional contacts have opposing raised lands to create compressive warping.

Figure 9:
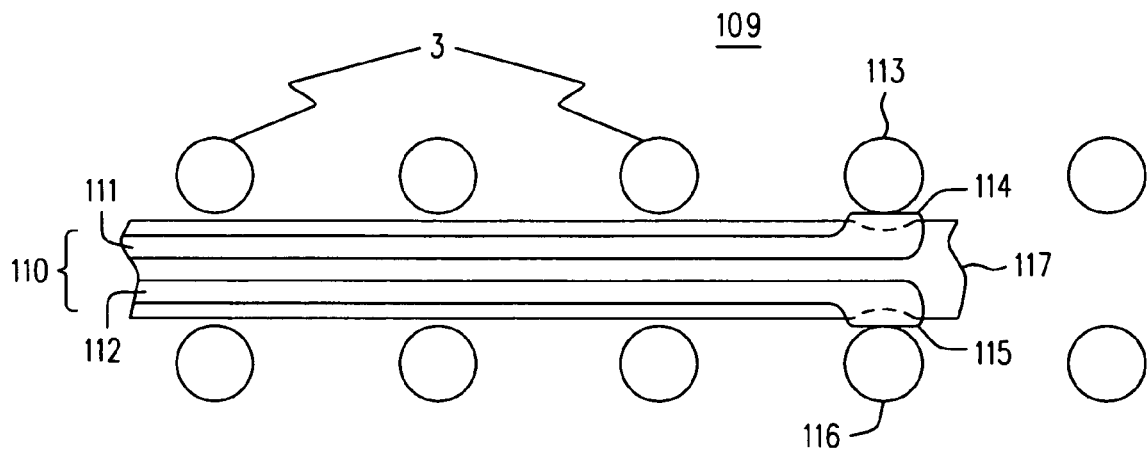
FIG. 9 is a simplified top view of an arm for an interjacent probe having extended contacts whose mating surfaces are flat.

We now continue with a brief mention of other alternate embodiments that concern the shape of the extended contacts. In FIG. 9 embodiment 109 has an arm 110 whose traces 111 and 112 end in respective contacts 114 and 115, each of which has a flat surface for touching leads 113 and 116, respectively. We have not shown a compressive warping assistance mechanism, although there might be one, and end 117 has been left unspecified, as it might be any of the types hereto disclosed.

Figure 10:
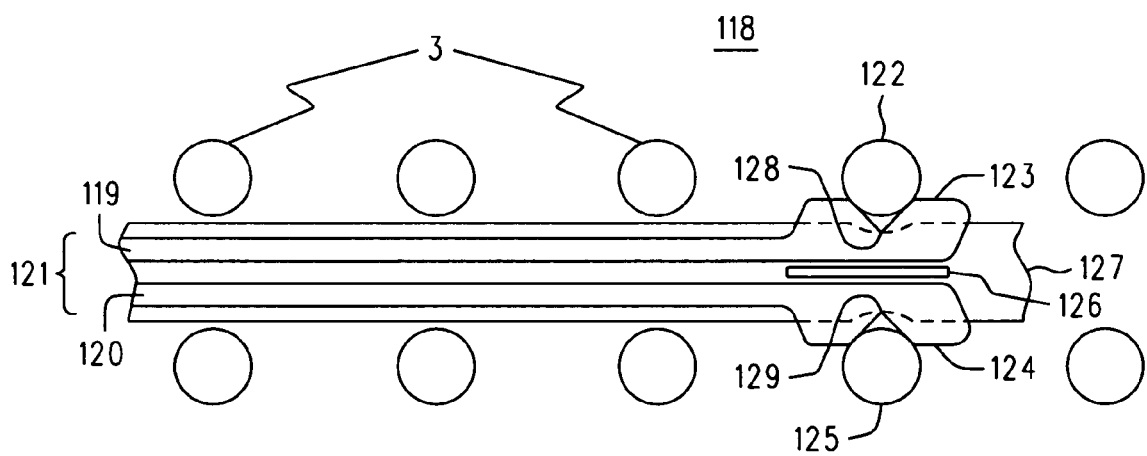
FIG. 10 is a simplified top view of an arm for an interjacent probe having extended contacts whose mating surfaces are flat regions including a notch.

In FIG. 10 embodiment 118 has an arm 121 whose traces 119 and 120 end in respective contacts 123 and 124. Each of contacts 123 and 124 has a flat surface containing a central detent or notch (128, 129) for touching leads 122 and 125, respectively. We have shown a slot 126 in the arm 121, disposed between the contacts 123 and 124, as a compressive warping assistance mechanism, although it might be absent, or be any of the sorts previously mentioned. End 127 has been left unspecified, as it might be any of the types hereto disclosed.

Figure 11:
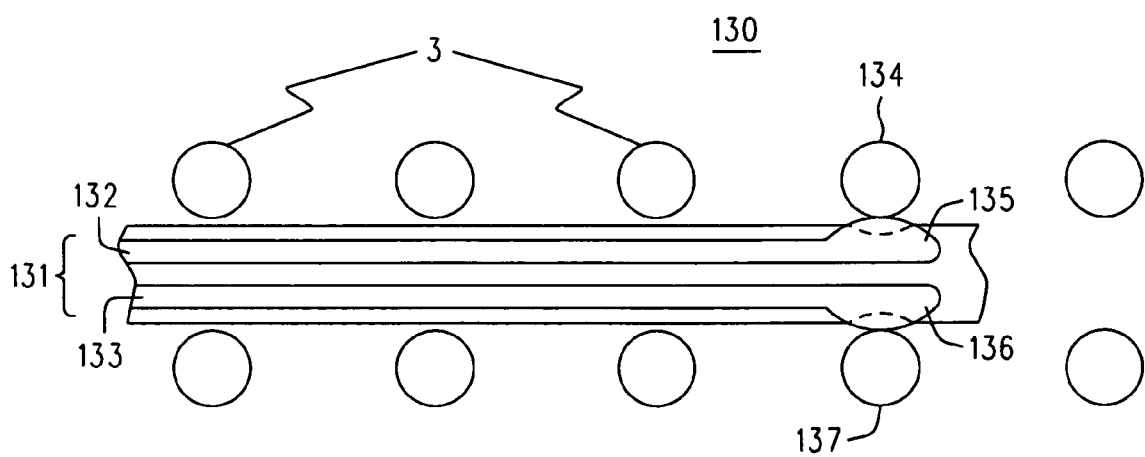
FIG. 11 is a simplified top view of an arm for an interjacent probe having extended contacts whose mating surfaces are convex.

In FIG. 11 embodiment 130 has an arm 131 whose traces 132 and 133 end in respective contacts 135 and 136, each of which has a convex surface for touching leads 134 and 137, respectively. We have not shown a compressive warping assistance mechanism, although there might be one, and which might be any of the types hereto disclosed.

It will be appreciated that we have disclosed a fair number of individual alternatives for various aspects of an interjacent probe. These aspects include whether the flexible printed circuit is single sided, double sided or multi-layer. They also include whether there are one, two, three, four or more traces on a given surface of an arm (i.e., upon a surface of a layer of the flexible printed circuit assembly), the number of arms, as well as the particular shape of the contacts, and if they are at the end of the arm or variously disposed along its length. They also include the choice of whether a lead of the IC is served by single contact and single trace, or if it is served by a plurality of contacts and traces (redundant probing), as well as whether the IC is affixed to a PCA by a BGA, LGA or through cylindrical leads entering either an array of vias or just a socket. And we have shown more than one way to achieve redundant probing: either by opposing contacts on adjacent arms, or by contacts at the same location along the length of an arm, but upon different sides of a substrate, or on different substrates of a multi-layer printed circuit arm. We have also shown many different ways to assist the arm in undergoing compressive warping, including the absence of such a mechanism. While we have shown some specific combinations of theses many alternatives as attractive examples, space does not permit an explicit mention of all possible combinations. We anticipate that when designing an interjacent probe for a particular class of applications, the usual case will be to independently consider each aspect and make suitable choices in light of the task at hand. It may well be the case that the resulting combination is one that is not explicitly set out herein, but which is nevertheless contemplated.

Figure 12:
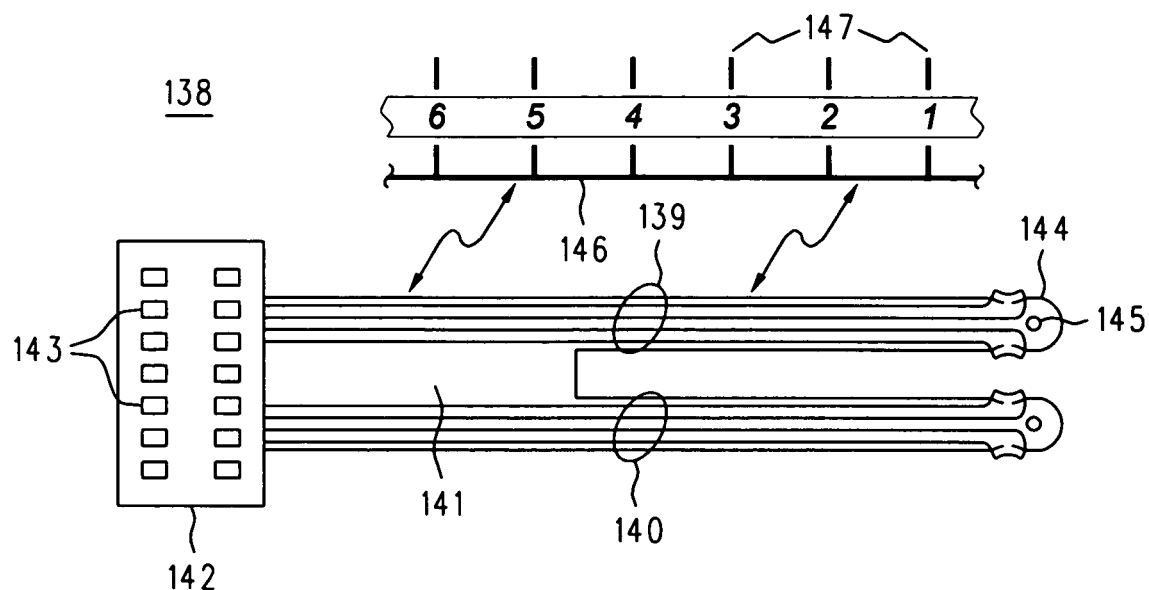
FIG. 12 is a simplified top view of an interjacent probe having a plurality of arms extending from a header and also including a scale for indicating the amount by which the probe is inserted beneath an IC.

Now consider the embodiment 138 of FIG. 12. It includes, by way of example only, two arms 139 and 140, and it will be understood that there might be just one arm, or more than two. Likewise, the depicted nature of the arm, it traces and related extended contacts, the shape of the end 144 and the nature of the compressive warping assistance mechanism 145, are all just exemplary. What is most of interest in FIG. 12 is that (in the case shown) the arms become a part of a single flexible printed circuit assembly, in that they are bifurcations extending from a region 141. Region 141 is shown as larger than needed for the routing of traces, although it could be used for that (say to perform the interconnections such as 66 and 67 of FIGS. 2 and 4 in support of redundant probing). Region 141 emerges from a header 142 that has pins or sockets 143 that are electrically coupled to the various traces of the arm(s). The test equipment (not shown) that receives the probed signals is connected to pins or sockets 143. The combination of 142/143 could also be a printed circuit mounted connector.

As simple as this notion of region 141 is, we have more to say about it. The first thing of which is that it might not be there. That is, a multiple arm interjacent probe might have two or more arms that extend from a common region that is not visible, as its boundaries are within the confines of the header 142; a top view such as shown in FIG. 12 would simply show the arms extending from the header and no region 141 (or perhaps only a very short one). Now, suppose that there were four arms. They might all be part of one flexible printed circuit assembly, or, two identical assemblies might be assembled side by side onto a common header, and each flexible printed circuit assembly might have (or not) its own version of region 141.

Here is why we think region 141 is useful. An arm for an interjacent probe to be used with a modern IC is apt to be fairly narrow. While it is conceivable that an interjacent probe, made for probing from the case side an otherwise inaccessible emitter or base of a TO-3 (old!) style transistor mounted in a socket, might use an arm perhaps three eighths of an inch wide (those leads are about 0.400" apart) and that arm might be up to a sixteenth of an inch thick. Such an interjacent probe would be as robust and easy to manipulate as any small screwdriver, and would probably not be thought of as being 'delicate'. But that is surely an extreme case, and it is much more typical that the width of an arm would be an eighth of an inch or less for newer modern integrated circuit applications of the sort that set us to work developing the interjacent probe. These more typical width arms are also considerably thinner, and such a one or two arm interjacent probe is positively dwarfed by the combined size of the operator's thumb and forefinger as he grasps the probe to manipulate it into position.

A good reason for having region 141 is to limit the independent length of multiple arms to about that which is needed for them to each be fully inserted into their respective 'corridor' between a row or column in an array 3 of leads for the IC. A single arm or a plurality of arms is easier to manipulate as a unit when the arm or arms is not any longer than necessary. Also, the presence of a region such as 141 implies that, to the left (in the figure) and back toward the header 142, the arms to the right are all part of one (larger and unitary) printed circuit assembly. That makes the mechanical joining of the header to that circuit assembly easier and more reliable.

Another good reason for the existence of a region such as 141 is this. Consider the case where the probe is to inserted beneath an IC at a location on the PCA having a nearby separate component that blocks easy board level horizontal entry into the gap between the IC and the surface of the PCA. Perhaps a quarter of an inch separates the IC from that other part, and that other part sticks up as high (or even higher) than the IC does. Now what? Well, you come down from the top, into the quarter inch separation. But the arms now have to bend, perhaps a full 90°, before they enter under the IC. As before, we don't want the separate lengths of the arms to be any longer than needed to straddle the column(s) of leads while penetrating to the desired lead layer beneath the IC, but we still need 'something to do the bending (which is quite external to the IC) and perhaps to also bend back (or bend even more) gracefully under the weight of the cabling to the test equipment. We prefer as convenient that the 'something' is a unitary region 141 rather than just extra length for the separate arms themselves.

FIG. 12 shows yet another feature for embodiment 138. A collection 147 of indicia is printed (silk screening is good) on one or more of the arms. The indicia might be in units of linear measure, such as inches or millimeters. It might be in numbers of IC lead layers penetrated. In any event, the idea is to indicate how far the arm has penetrated beneath the IC, so as to be able to tell it if is probing lead(s) at the correct layer. It will be appreciated that this does not assist in selecting the correct location along the periphery of the IC to insert the interjacent probe, but we note that it is conventional for indicia related to that information to already be printed on the PCA or on the IC itself. Indicia such as 147 can be applied one or more times to any of the arms depicted in the various embodiments described hereto.

Figure 13:
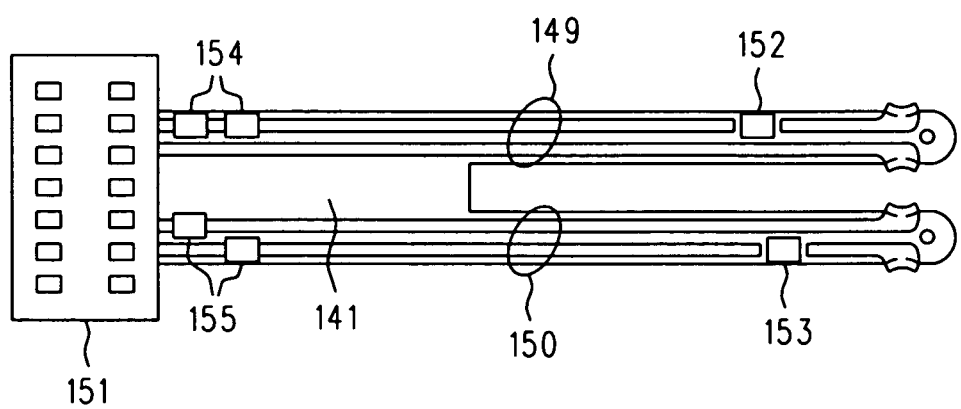
FIG. 13 is a simplified top view of an interjacent probe having a plurality of arms extending from a header, those arms including various components, such as isolation and matching resistors, disposed amid the traces thereon.

Now consider the embodiment 148 depicted in FIG. 13. As was the case with FIG. 12, embodiment 148 has two arms 149 and 150 that emerge from a header 151. As before, the number of arms and their independent length compared to the overall length of the interjacent probe as a whole are matters for the designer to consider in light of anticipated applications, and which we have already addressed. What interests us in the embodiment 148 is the presence of the various assorted components 152-155. We show several, and it will be understood that the drawing in FIG. 13 is merely exemplary. Only one trace (signal of interest) might have such a component, or, there might be one or two components per trace (signal). These components 152-155 might be series isolation or damping resistors, or, in the case of transmission lines fabricated on the arms, be resistive terminations matching a characteristic impedance. Attenuators are another possibility.

Components, such as 152 and 153, that are located on parts of an arm that will pass beneath the IC need to be suitably thin. Instances of such components that are resistive can be film depositions across corresponding gaps provided in the trace, and that are made and may be subsequently protected using conventional techniques (e.g., thick film processes). Components such as 154 and 155, that are not located so as to ever pass beneath the IC or are in a region such as 141, can be regular SMT parts or might be formed as are parts 152 and 153, perhaps even at the same time.

It was mentioned earlier in connection with FIGS. 5C and 6B that traces leading to their extended contacts could be transmission lines. Once transmission lines are in use the abilities to control source impedance and provide resistive terminations are welcome ones. The notion of redundant probing, however, may lead to complications whose solutions, while not altogether unknown, we briefly mention here for the sake of completeness and so that they won't be overlooked. In a case where the business end of a probe is served by a transmission line, and two transmission lines of characteristic impedance $Z_0$ are to be operated in parallel for an improved result, the parallel combination will appear to have a characteristic impedance of $Z_0/2$. So, let's assume that the test equipment has a 50Ω input and that 50Ω coaxial cable is to be attached via header (or connector) 143 to traces forming strip lines (or perhaps co-planar) transmission lines on the interjacent probe. Providing the connection at the header/connector 143 may be accomplished by using any of the commercially available 50Ω RF connectors manufactured for such a purpose.

Two cases now seem reasonable. The first is that at the probe side of the header/connector 143 the 50Ω signal of interest is meet immediately by two 100Ω transmission lines. The second is that it is met by a single 50Ω transmission line that some distance away and at some convenient location (say within a region such as 141) enters a 'tee' portion, from which it emerges as two 100Ω lines. Given that such considerations are recognized and understood, it would not be surprising to find in a 'fifty ohm system' that employed redundant interjacent probing a number of 100Ω resistances disposed upon the traces in the manner of components 152/153 and 154/155. Likewise, it might be that the values for isolation and/or damping resistances would be selected with 100Ω transmission lines in mind, as opposed to 50Ω, even though the test equipment has fifty ohm inputs.

Figure 14:
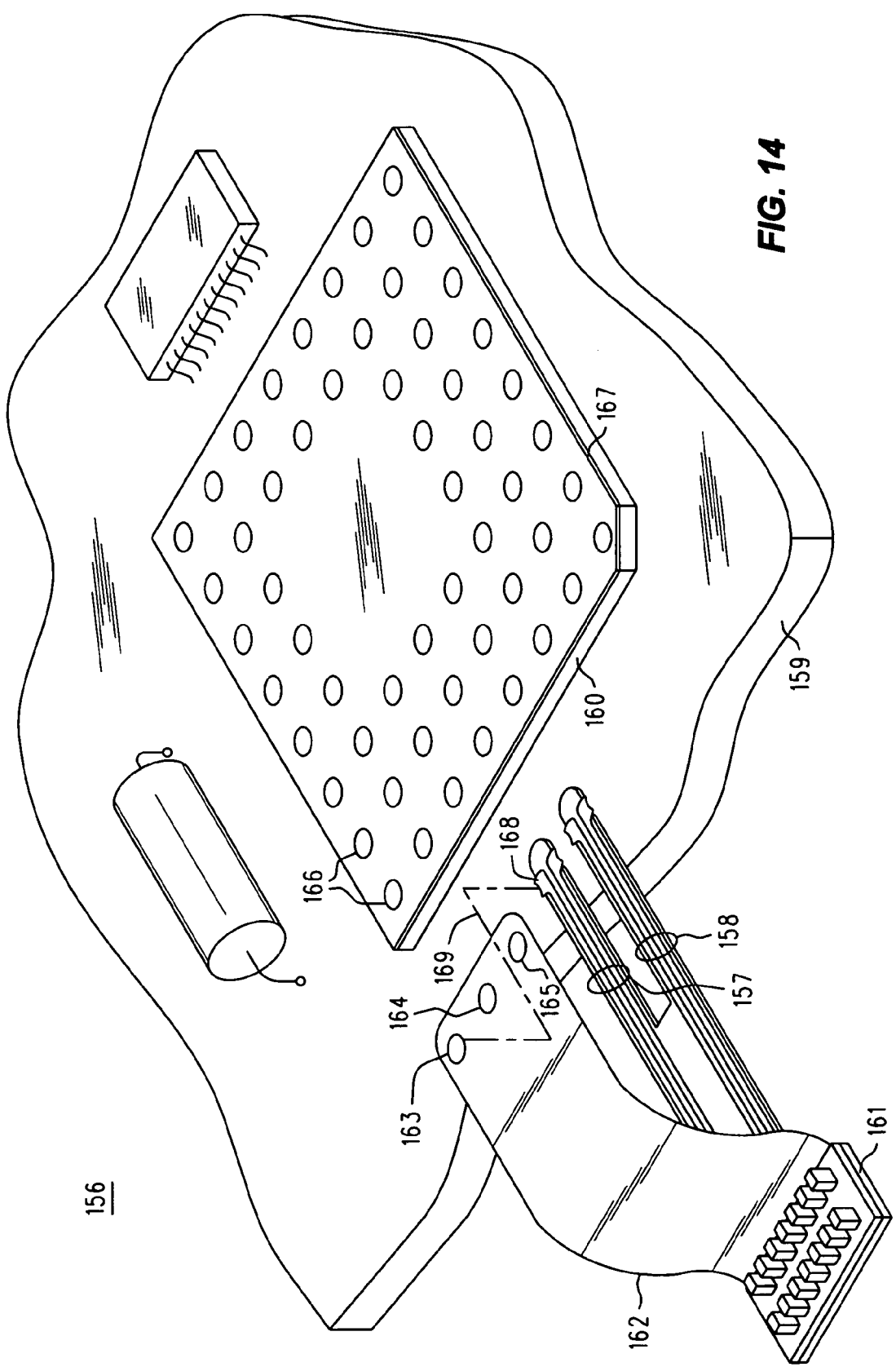
FIG. 14 is a simplified perspective view of an interjacent probe that has been equipped with a header and with a reticle sight for indicating which leads are being probed for an IC whose top surface carries indicia representing the locations of it leads.

Now consider the embodiment 156 depicted in FIG. 14. It will be appreciated that, just as does FIG. 12, it concerns a way to determine which leads of an IC 160 on PCA 159 are being probed, and in so doing helps an operator steer an interjacent probe into contact with desired leads of the IC. The interjacent probe of FIG. 14 has two arms 157 and 158 depending from a header 161, but it will readily be appreciated that any of the preceding embodiments and their variations are included in the subject matter of which the figure is but an example. With this in mind, note that the arms 157 and 158 are of a configuration that can touch three leads at a time. Anchored by the header (or perhaps simply glued to the flexible printed circuit assembly), and positioned above the arms is a finger, or strap that has three holes, or reticle mechanisms 163, 164 and 165. The strap 162, which may be of a suitable plastic, has been depicted as sprung upward and away from the arms 157 and 158, and pulled back toward the header 161, such that it would appear to have an S-curve as it leaves the header. This has been done in the drawing to get it out of the way so that the arms and their extended contacts are visible. In its normal state the strap 162 would lie just above the arms, and be 'stretched out' full length, as it were. Note that a dashed line (169) indicates that left-most hole or reticle 163 is in alignment with the left-most extended contact (168) of the left-most arm 157. The idea is that there is a pattern of indicia 166 on the top of the IC 160 that is aligned to the leads on the bottom, so that when the interjacent probe is inserted the holes or reticles 163-165 will line up over indicia corresponding to the leads that the extended contacts are probing. The strap 162 has reticles that are holes; it will be appreciated that these might, if desired, be replaced with narrow pointers extending from and edge (not shown). In such a case the tip of the pointer would correspond to the center of a reticle or hole.

The indicia 166 can be circles applied by a silk screen process at the time the IC is made, or even afterward. An alternative to applying the indicia to the IC as part of its manufacture is to apply at later time a sticky-backed label bearing the desired indicia. (Such an after-the-fact label 167 is actually what is shown in the figure.) The diameter of the circles can be slightly less than the diameter of the holes or reticles in the strap, the better to be able to detect exact alignment (centering of the indicia within the reticles).

Beside being able to guide the interjacent probe to a desired lead or leads, and verify that it really is there and not somewhere else, there is an additional advantage in that if the 'by feel' method of positioning is difficult to interpret, or the operator is inexperienced in its use, a mis-alignment causing some contacts to be in marginal proximity of their intended leads will also provide visual cue. Or, to turn it around, if margins, wear or other conditions conspire to prevent all of a plurality of contacts to 'act like detents when properly registered,' owing to their doing so separately and one at a time instead of in unison, the 'by feel' method might not give a reassuring indication of proper alignment (and by implication, proper electrical contact for probing), especially if a fair number of leads are being probed at the same time. In such a case the use of indicia on top of the IC in conjunction with a strap having holes or reticles in alignment with the extended contacts of the interjacent probe will allow probing to proceed with confidence, nonetheless.

We touch now on the manufacturing techniques that may be used to fabricate an interjacent probe. In the event that it is made from Kapton and copper foil as the basis for the flexible printed circuit, many known conventional techniques may be employed, as that stuff is widely in a large number of products in commerce. Photolithography, laminating, routing, drilling shearing and plating all come to mind, as do processes for vias in support of double sided and multi-layer flexible printed circuits. There are two things that motivate us to add something that, while in itself is conventional, may not be widely known. These two things are: (1) The small size of the arms—drilling and shearing such small parts can present problems; and (2) The notion of 'extended contacts' that stick out beyond the substrate and that are shown in many of the figures (e.g., FIGS. 5A and 5D). The small size of the parts can make it particularly difficult to form such extended contacts.

Here is a preferred way to do it. The periphery of the arm is formed according to any suitable technique (e.g., die cutting) as though there were no copper foil extending beyond the edge of the Kapton and each were to share the same portion of the periphery. Then the Kapton (and only the Kapton) underlying the outer region of the contact is removed with a CVL (Copper Vapor Laser) to produce a portion of the contact that now extends out into space beyond a new periphery of the Kapton at that location. Voila, behold an 'extended contact.'

For further information about this, and that is supported by some impressive photographs indicating just how well behaved and precise such a Kapton removal process can be, visit www.oxfordlasers.com, navigate to a page of the site dealing with 'INDUSTRIAL DIVISION' and then to Applications/Case Studies and peruse the data sheet entitled 'Micro vias in kapton on copper' and which also subsequently identifies itself as 'Case Study B3.' These laser operations operate in the range of 250 nm to 290 nm (Ultra Violet), and are useful not only for the creation of extended (exposed beyond the periphery of the substrate) copper contacts by the removal of underlying Kapton, but also for the creation of vias, whether blind or through, in multilayer embodiments. A CVL can be used to neatly remove Kapton, while other known conventional laser techniques (e.g., Visible Light Lasers) can be used to remove the copper foil. The aforementioned web site contains a wealth of information about these processes.

Figure 15A:
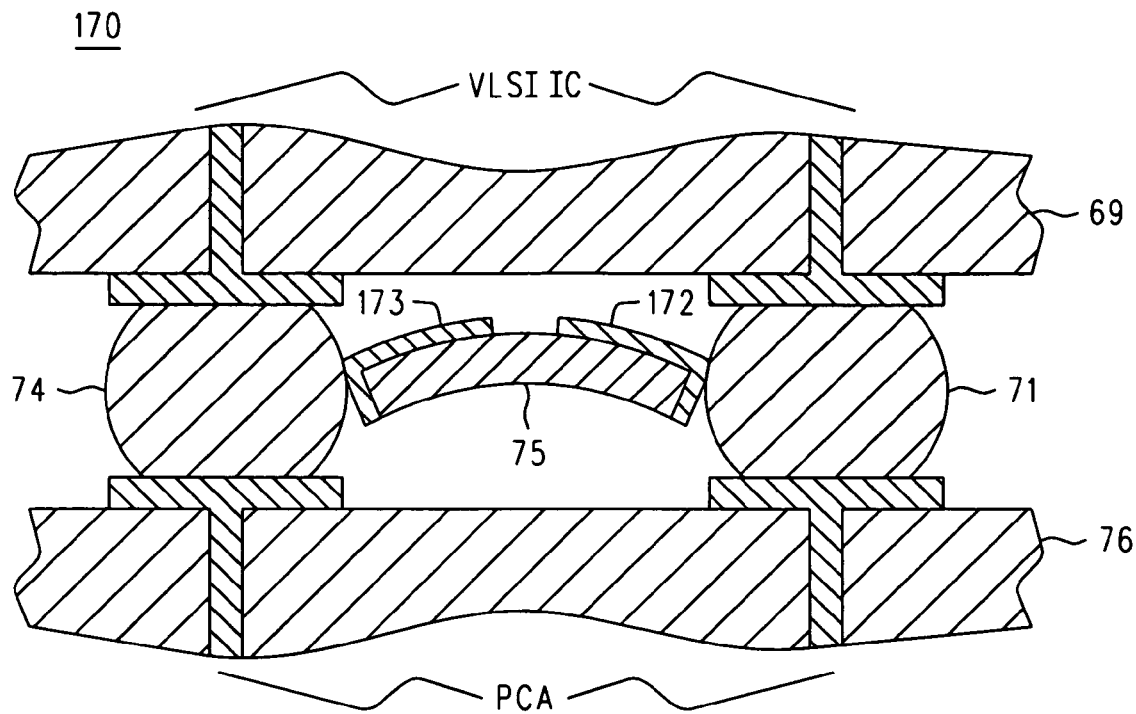
FIG. 15A is a simplified section view, similar to FIG. 5D, but showing as an alternative to extended contacts a first style of wrap-round contacts that may be obtained by a plating operation.
Figure 15B:
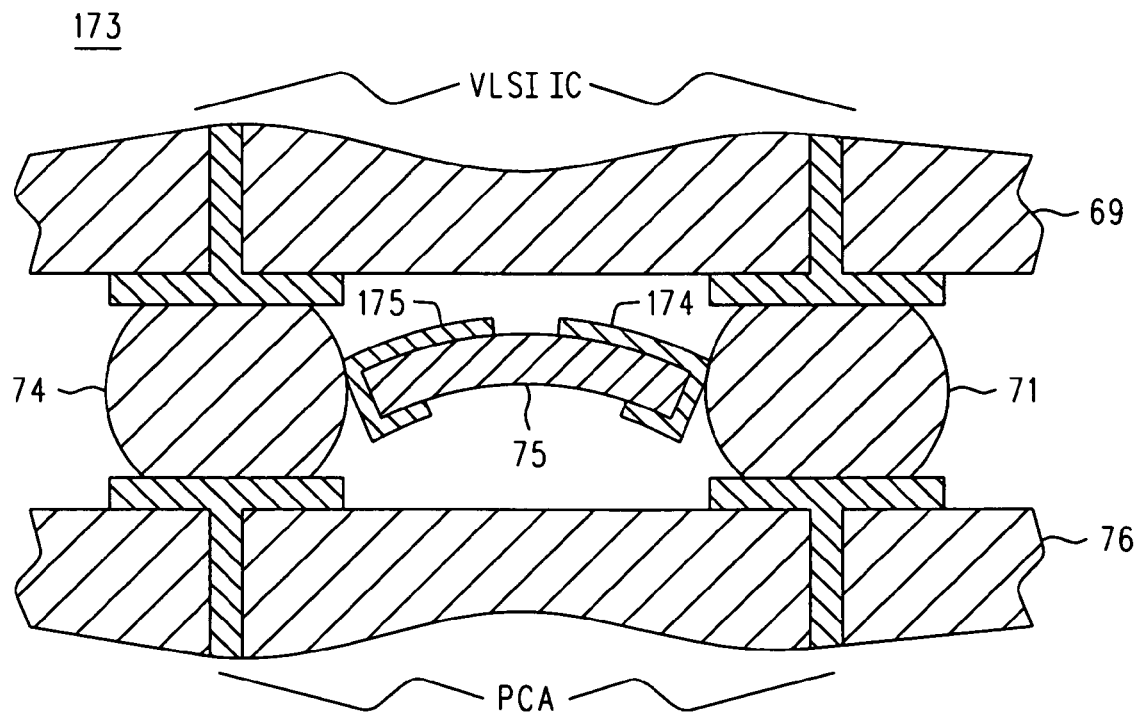
FIG. 15B is a simplified section view, similar to FIG. 5D, but showing as an alternative to extended contacts a second style of wrap-round contacts that may be obtained by a plating operation

It will further be appreciated that the feature we have identified as an 'extended contact' can be in nearly all instances be replaced by what we may term a 'wrap-around' contact, as shown in the embodiments 170 and 173 of FIGS. 15A and 15B. In FIG. 15A contacts 171 and 172 extend not into empty space, but descend down the face of the thickness of the dielectric substrate 75. In FIG. 15B the contacts 174 and 175 not only extend down that thickness, but also travel back on the underside of the substrate 75. These 'wrap-around' contacts may be formed by the same plating techniques that are conventionally used to create vias. In the case of FIG. 15B the (horizontal) parallel portions of the contact 174 (175) that are joined by the (vertical) section traversing the thickness of the substrate are each created by the normal photolithograph and etch processes. In both FIGS. 15A and 15B the section that traverses the thickness of the substrate 75 is formed by plating, as for creation of a via.

It will, upon reflection, be appreciated that any of the heretofore mentioned shapes for contacts (convex, concave, etc.) can also be formed as wrap-around (plated) contacts, instead of as 'extended contacts.' Take care to note, however, that in both cases the resulting contact extends outward from the arm, in that the top view profile of the arm at the location of the contact is that of a bulge. That is, in our terminology both 'extended contacts' and 'wrap-around contacts' do extend outward from their arm, but the physical constitution of 'wrap-around contacts' is not the same as that of 'extended contacts.' All that said, it will therefor be readily understood that in almost all cases (the exception being cases like that of FIG. 6C) our use in this Specification of the term 'extended contact' or 'extended contacts' can be replaced by 'wrap-around contact' or 'wrap-around contacts.'

To conclude, we also briefly state the underlying method of the interjacent probe technique. An arm of generally flexible but not compressible dielectric material has a width sufficiently narrow and a thickness sufficiently thin to allow its insertion beneath an electronic component and its penetration between adjacent columns of leads in an array of leads that connect an electronic component to a circuit assembly. The arm has a contact region slightly wider than the space between adjacent leads, and periodically undergoes compressive warping as the arm is inserted and the contact region passes successive layers of leads in the array. The contact region has a conductive contact that is thus urged against the lead to which it is proximate, and the electrical signal on that lead is probed. The probed signal is coupled by a trace to external connections that convey the probed signal to electronic test equipment. Opposing contacts on the arm may be placed into compression against adjacent leads at the same time. The contact region of the arm may be prevented from twisting under compression by adding shims to limit the amount of headroom that allows such twisting. Multiple arms may be inserted at the same time, and the depth of insertion may be gauged by viewing indicia printed along the arm. A reticle assembly may be aligned with and carried by the arm to cooperate with indicia on the surface of the electronic component and indicate which lead or leads are being probed.

We claim:

1. Apparatus for probing electronic signals appearing on leads within an array of leads for an electronic component, the apparatus comprising:

a flexible printed circuit;

one or more electrical connections disposed upon a first portion of the flexible printed circuit, for coupling to an item of electronic test equipment probed electronic signals;

the flexible printed circuit comprising a first arm extending from the first portion and sufficiently narrow to be inserted between adjacent columns of leads in the array thereof and by which array the electronic component is electrically connected to a circuit assembly, the first arm sufficiently thin to pass into a gap between the electronic component and the circuit assembly;

a first electrical contact disposed at a first location along an edge of the first arm and extending outward from that edge for probing a lead in the array when the first arm is inserted a selected distance;

a first conductive trace carried by the first arm and electrically coupling the first electrical contact to an associated one of the electrical connections disposed upon the first portion; and the first electrical contact extending outward from the first arm by an amount sufficient to cause the electrical contact and the first location along the first arm to undergo compressive warping and urge the first electrical contact against a probed lead.

2. Apparatus as in claim 1 further comprising a void in the flexible printed circuit proximate the first location along the first arm and of a size and shape selected to increase the ease with which the first electrical contact and the first location along the first arm undergo compressive warping.

3. Apparatus as in claim 1 further comprising a second electrical contact disposed along an opposite edge of the first arm and extending outward from that opposite edge by an amount sufficient to cause the second electrical contact and its location along the opposite edge to undergo compressive warping, and a second conductive trace carried by the first arm and electrically coupling the second electrical contact to an associated one of the electrical connections disposed 6 upon the first portion.

4. Apparatus as in claim 1 wherein the flexible printed circuit further comprises a second arm 2 extending from the first portion, adjacent the first arm and on the side thereof having the first electrical contact, the second arm having a second electrical contact disposed along an edge of 4 the second arm and extending outward hm that edge and toward the first electrical contact by an amount sufficient to cause the second electrical contact and its location along the edge of the 6 second arm to undergo compressive warping, and a second conductive trace carried by the second arm and electrically coupling the second electrical contact to an associated one of the electrical connections disposed upon the first portion.

5. Apparatus as in claim 4 wherein the first and second conductive traces are electrically coupled together within the first portion of the flexible printed circuit.

6. Apparatus as in claim 1 wherein the first electrical contact includes one of a concave region, a convex region, and a flat region.

7. Apparatus as in claim 1 wherein the flexible printed circuit includes a substrate having a thickness and one of the first electrical contact extends outward beyond the substrate without lying upon a surface created by the exposed thickness and one of the first electrical contact extends along a surface created by the exposed thickness.

8. Apparatus as in claim 1 wherein the first conductive trace comprises a transmission line.

9. Apparatus as in claim 1 wherein the first conductive trace is coupled to one of a resistive component disposed along the arm and a resistive component disposed within the first portion.

10. Apparatus as in claim 1 wherein the first arm includes at least one layer of dielectric material acting as a shim to limit the mount of the space remaining between and inserted first arm and the gap between the electronic component and the circuit assembly and to prevent twisting 4 during compressive warping.

11. Apparatus as in claim 1 wherein the first arm includes visible indicia corresponding to a spacing of the leads in the array and extending in the direction along which the first arm is inserted.

12. Apparatus as in claim 1 wherein the leads of the array belong to a BGA.

13. Apparatus as in claim 1 wherein the leads are cylindrical rods and the electronic component is 2 attached to the circuit assembly through a socket.

14. Apparatus as in claim 1 further comprising a strap extending from the first portion in the same 2 direction as the first arm, having an indicator in alignment with the location of a lead that will be probed by the first electrical contact, and lying against an outside surface of the electronic component when the first arm is inserted between the electronic component and the circuit assembly.

15. Apparatus as in claim 14 wherein the indicator comprises an orifice.

16. Apparatus as in claim 14 further comprising an adhesive label having indicia thereon that, when the label is adhered to a surface of the electronic component, correspond to the locations of leads in the array of leads that connects the electronic component to the circuit assembly.

* * * * *

UNITED STATES PATENT AND TRADEMARK OFFICE
CERTIFICATE OF CORRECTION

PATENT NO. : 7,372,284 B2
APPLICATION NO. : 11/345007
DATED : May 13, 2008
INVENTOR(S) : Holcombe et al.

Page 1 of 1

It is certified that error appears in the above-identified patent and that said Letters Patent is hereby corrected as shown below:

In column 19, line 33, in Claim 1, after "inserted" insert -- at --.

In column 19, line 55, in Claim 3, after "disposed" delete "6".

In column 19, line 58, in Claim 4, after "arm" delete "2".

In column 20, line 2, in Claim 4, after "of" delete "4".

In column 20, line 3, in Claim 4, delete "hm" and insert -- from --, therefor.

In column 20, line 6, in Claim 4, after "the" delete "6".

In column 20, line 31, in Claim 10, delete "mount" and insert -- amount --, therefor.

In column 20, line 31, in Claim 10, before "space" insert -- free --.

In column 20, line 33, in Claim 10, after "twisting" delete "4".

In column 20, line 42, in Claim 13, after "is" delete "2".

In column 20, line 45, in Claim 14, after "same" delete "2".

Signed and Sealed this

Twenty-ninth Day of September, 2009

David J. Kappos
*Director of the United States Patent and Trademark Office*